(12) United States Patent
Huang et al.

(10) Patent No.: US 10,483,269 B2
(45) Date of Patent: Nov. 19, 2019

(54) EEPROM DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Peng Huang, Shanghai (CN); Jun Li, Shanghai (CN); Honggang Dai, Shanghai (CN); Guanguan Gu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/103,725

(22) Filed: Aug. 14, 2018

(65) Prior Publication Data
US 2018/0366480 A1    Dec. 20, 2018

Related U.S. Application Data

(62) Division of application No. 15/362,551, filed on Nov. 28, 2016, now Pat. No. 10,079,241.

(30) Foreign Application Priority Data

Jan. 12, 2016    (CN) .......................... 2016 1 0017721

(51) Int. Cl.
*H01L 27/11521*    (2017.01)
*H01L 21/8234*    (2006.01)
(Continued)

(52) U.S. Cl.
CPC .. *H01L 27/11521* (2013.01); *H01L 21/28273* (2013.01); *H01L 21/311* (2013.01);
(Continued)

(58) Field of Classification Search
CPC ......... H01L 27/11521; H01L 21/28273; H01L 21/311; H01L 21/31111; H01L 21/31116
See application file for complete search history.

(56) References Cited

U.S. PATENT DOCUMENTS 8,390,079 B2   3/2013  Horak et al.
2005/0051835 A1  3/2005  Kang et al.
(Continued)

FOREIGN PATENT DOCUMENTS

FR   2855325   11/2004

OTHER PUBLICATIONS

U.S. Appl. No. 15/362,551, "Non-Final Office Action", dated Jan. 22, 2018, 11 pages.
(Continued)

*Primary Examiner* — Nathan W Ha
(74) *Attorney, Agent, or Firm* — Kilpatrick Townsend & Stockton LLP

(57) ABSTRACT

A semiconductor device includes a semiconductor substrate, a first dielectric layer having a first thickness on the semiconductor substrate, a first opening having a first width in the first dielectric layer, a second dielectric layer having a second thickness disposed in a middle region of the first opening, and a third dielectric layer having a first portion and a second portion disposed on opposite sides of second dielectric layer. The first portion and the second portion have a second width smaller than the first width, and the third dielectric layer has a third thickness smaller than the first thickness and the second thickness.

6 Claims, 9 Drawing Sheets

(51) Int. Cl.
 H01L 21/28      (2006.01)
 H01L 21/311     (2006.01)
 H01L 29/423     (2006.01)
 H01L 21/32      (2006.01)
(52) U.S. Cl.
 CPC ... *H01L 21/31111* (2013.01); *H01L 21/31116* (2013.01); *H01L 21/32* (2013.01); *H01L 21/823468* (2013.01); *H01L 29/42324* (2013.01)

(56) References Cited

U.S. PATENT DOCUMENTS

| | | | |
|---|---|---|---|
| 2005/0208744 A1 | 9/2005 | Jeon et al. | |
| 2007/0228498 A1* | 10/2007 | Toba | H01L 21/28282 257/411 |
| 2007/0290274 A1* | 12/2007 | Yaegashi | H01L 27/115 257/390 |
| 2008/0277713 A1* | 11/2008 | Maekawa | H01L 27/115 257/316 |
| 2009/0014773 A1 | 1/2009 | Hsiao et al. | |
| 2009/0186460 A1 | 7/2009 | Niel | |
| 2013/0069135 A1* | 3/2013 | Nakahara | H01L 29/42324 257/316 |
| 2013/0105880 A1* | 5/2013 | Kim | H01L 21/28273 257/316 |
| 2013/0175637 A1* | 7/2013 | Chang | H01L 21/823468 257/383 |
| 2013/0341658 A1 | 12/2013 | Lee et al. | |
| 2014/0061939 A1 | 3/2014 | Yu et al. | |
| 2014/0374812 A1* | 12/2014 | Ge | H01L 29/7881 257/316 |
| 2017/0200728 A1 | 7/2017 | Huang et al. | |

OTHER PUBLICATIONS

U.S. Appl. No. 15/362,551, Notice of Allowance dated May 18, 2018, 7 pages.
U.S. Appl. No. 15/362,551, Restriction Requirement dated Sep. 13, 2017, 7 pages.
European Patent Application No. 17150399.8, Extended European Search Report dated Jun. 2, 2017, 9 pages.

* cited by examiner

EEPROM DEVICE

CROSS-REFERENCES TO RELATED APPLICATIONS

This application is a divisional of U.S. patent application Ser. No. 15/362,551, filed on Nov. 28, 2016, which claims priority to Chinese Patent Application No. 201610017721.2, filed on Jan. 12, 2016, the content of which is incorporated herein by reference in its entirety.

BACKGROUND OF THE INVENTION

Field of Invention

The present invention relates to semiconductor devices, and more particularly to a semiconductor device and method for manufacturing the same.

Background

An electrically erasable read-only memory (EEPROM) device can retain stored data when the power supply is removed. It can erase data already stored in the memory and reprogram the memory. An EEPROM device is an important data storage device. It stores data by applying a voltage to a control gate so that electrons can tunnel through a tunnel oxide layer into a floating gate to store the data. However, with the continuous advance in semiconductor technology and application requirements, the ever-decreasing feature size of the EEPROM device imposes stricter requirements to device manufacturing processes. This is due to the smaller size of the EEPROM tunneling oxide layer relatively to the Flash memory device. For example, for an EEPROM device below 0.15 um, the width of the tunnel oxide layer is about 90 nm. The tunnel oxide layer is generally manufactured using advanced lithography and etching processes to define a small channel, and the channel is then processed in a furnace. However, due to the limited resolution of conventional lithography processes, the channel size is relatively large after exposure and development processes, so that the 90 nm channel requirement for a 0.15 um technology node cannot be met.

Current techniques for solving the limited lithography resolution focus on the development of advanced lithography technology and equipment; however, advanced lithography equipment requires a large capital investment and is expensive to operate and maintain. Thus, there is a need for a novel method for solving the above problems.

BRIEF SUMMARY OF THE INVENTION

Embodiments of the present invention provide a method for manufacturing a semiconductor device. The method includes providing a semiconductor substrate, forming a first dielectric layer having a first thickness on the semiconductor substrate, forming a first opening having a first width in the first dielectric layer, the first opening exposing a surface of the semiconductor substrate, forming a spacer on opposite sidewalls of the first opening, forming a second dielectric layer having a second thickness on the exposed surface of the semiconductor substrate in a middle region of the first opening, removing the spacer to form a second opening having a first opening portion and a second opening portion on opposite sides of the second dielectric layer, each of the first and second opening portions having a second width, and forming a third dielectric layer having a third thickness on the first and second opening portions of the second opening. The third thickness is smaller than the first thickness and the second thickness.

In one embodiment, the second thickness is smaller than the first thickness.

In one embodiment, forming the first opening includes forming a hardmask layer on the first dielectric layer, forming an anti-reflection layer on the hardmask layer, forming a third opening having the first width in the hardmask layer and the anti-reflection layer, and performing an etching process on the first dielectric layer using the hardmask layer and the anti-reflection layer as a mask.

In one embodiment, performing the etching process includes performing a dry etching process to remove a portion of the first thickness of the first dielectric layer while retaining a remaining portion of the first thickness of the first dielectric layer, and removing the remaining portion of the first thickness of the first dielectric layer using a first buffered oxide etchant (BOE) solution.

In one embodiment, forming the spacer includes forming a spacer material layer having a thickness on a bottom and on sidewalls of the first opening, and removing a portion of the spacer material layer disposed on the bottom of the first opening.

In one embodiment, removing the spacer material layer on the bottom of the first opening includes removing a portion of the thickness of the spacer material layer on the bottom of the first opening while retaining a remaining portion of the thickness of the spacer material layer, and removing the remaining portion of the thickness of the spacer material layer using a second buffered oxide etchant (BOE) solution.

In one embodiment, the method may further include forming a gate material layer on the third dielectric layer. The gate material layer covers a portion of the third dielectric layer disposed on one of the first and second opening portions of the second opening.

In one embodiment, the third dielectric layer is a tunneling oxide layer, and the gate material layer is a floating gate.

In one embodiment, the spacer has a high etching selectivity relative to the second dielectric layer.

In accordance with the present invention, the method includes forming a first opening having a relatively larger width in a first dielectric layer, then forming a spacer on sidewalls of the first opening. The method also includes forming a second dielectric layer in a middle (central) region of the first opening, removing the spacer to form a second opening having a relatively smaller width, and forming thereafter a third dielectric layer in the second opening, such that the third dielectric layer has an even smaller width than that of the second opening. The method according to the present invention can using existing process equipment without resorting to the use of expensive equipment and advance technology, thereby lowering the production cost of the semiconductor device.

Embodiments of the present invention also provide a semiconductor device including a semiconductor substrate, a first dielectric layer having a first thickness on the semiconductor substrate, a first opening having a first width in the first dielectric layer, a second dielectric layer having a second thickness disposed in a middle region of the first opening, and a third dielectric layer having a first portion and a second portion disposed on opposite sides of second dielectric layer. The first portion and the second portion each have a second width smaller than the first width, and the third dielectric layer has a third thickness smaller than the first thickness and the second thickness.

In one embodiment, the second thickness is smaller than the first thickness.

In one embodiment, the semiconductor device may further include a gate material layer on the third dielectric layer. The gate material layer is disposed on one of the first and second portions of the third dielectric layer.

Embodiments of the present invention also provide an electronic device comprising a semiconductor device and an electronic component connected to the semiconductor device. The semiconductor device includes a semiconductor substrate, a first dielectric layer having a first thickness on the semiconductor substrate, a first opening having a first width in the first dielectric layer, a second dielectric layer having a second thickness disposed in a middle region of the first opening, and a third dielectric layer having a first portion and a second portion disposed on opposite sides of second dielectric layer. The first portion and the second portion each have a second width that is smaller than the first width, and the third dielectric layer has a third thickness smaller than the first thickness and the second thickness.

In one embodiment, the semiconductor device further includes a gate material layer disposed on the third dielectric layer. The gate material layer is disposed on one of the first and second portions of the third dielectric layer.

The following description, together with the accompanying drawings, will provide a better understanding of the nature and advantages of the claimed invention.

DETAILED DESCRIPTION OF THE INVENTION

Figure 1:
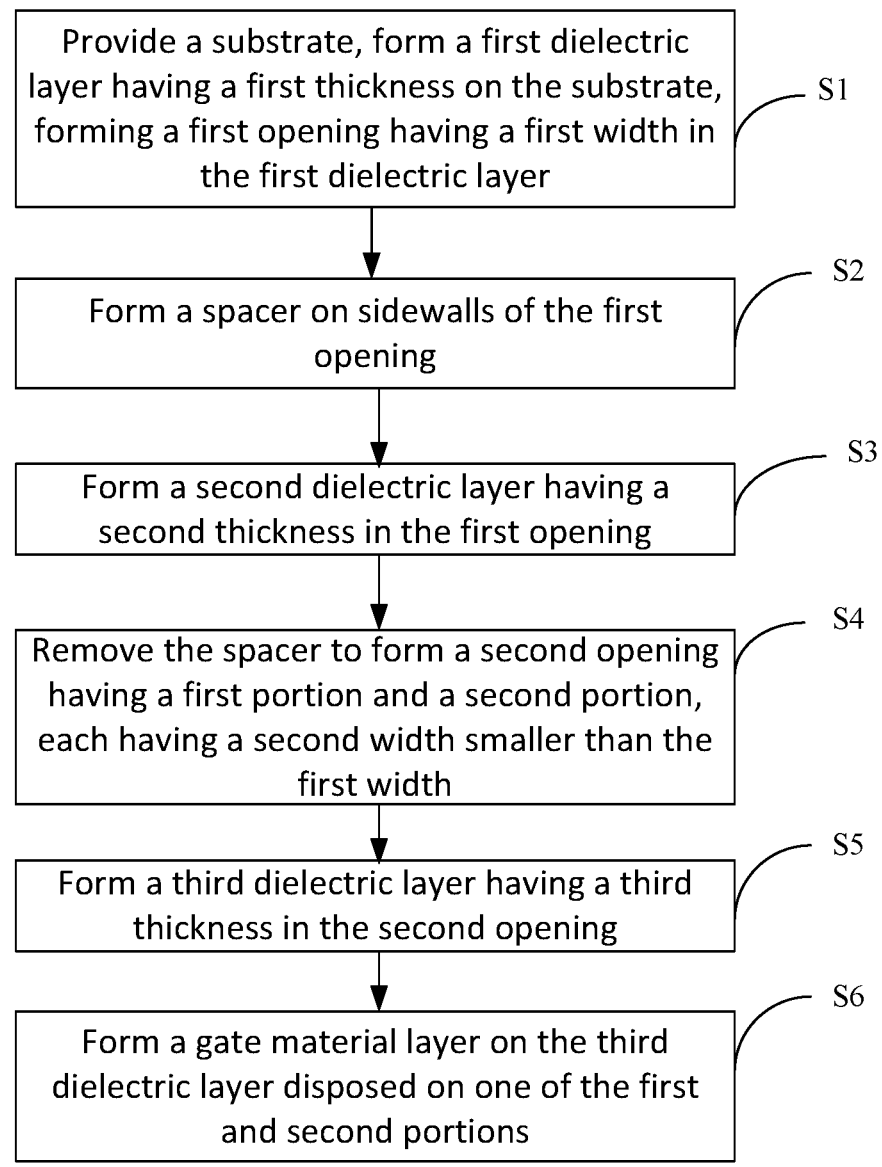
FIG. 1 is a flowchart of a method for manufacturing a semiconductor device according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "overlying," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having", "containing" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term"horizontal" refers to a direction perpendicular to the vertical as defined above.

Embodiments of the invention are described herein with reference to cross-section illustrations that are schematic illustrations of idealized embodiments and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

In order to solve the above-described problems that require advanced lithography processes to form a small size tunnel oxide layer for technology nodes below 0.15 um, such as a 90 nm tunnel oxide layer, embodiments of the present invention provide a novel manufacturing method.

FIG. 1 illustrates a flowchart of a method for manufacturing a semiconductor device according to an embodiment of the present invention. The method may include:

S1: providing a semiconductor substrate; forming a first dielectric layer having a first thickness on the semiconductor substrate; forming a first opening having a first width in the first dielectric layer, the first opening exposes a first surface of the semiconductor substrate;

S2: forming a spacer on opposite sidewalls of the first opening;

S3: forming a second dielectric layer having a second thickness in the first opening, the second dielectric layer has a second width smaller than the first width;

S4: removing the spacer on the sidewalls of the first opening to form a second opening, the second opening has a first opening portion and a second opening portion, each having a second width that is smaller than the first width;

S5: forming a third dielectric layer having a third thickness in the second opening, the third thickness is smaller than the first thickness and the second thickness;

S6: forming a gate material layer on the third dielectric layer.

According to the manufacturing method of the present invention, a first opening having a relatively larger width is formed in the first dielectric layer, and a spacer is formed on the sidewalls in the first opening. Thereafter, a second dielectric layer is formed in the middle (center) region of the first opening, a second opening having a relatively smaller width is then formed by removing the spacer. Next, a third dielectric layer is formed in the second opening, so that the third dielectric layer has an even smaller width. Thus, there is no need for the use of more advanced lithography technology and equipment in the manufacturing process; and existing manufacturing processes and equipment can be used to reduce production costs.

In the following description, specific details are set forth in order to provide a thorough understanding of the present invention. It will be apparent, however, to one skilled in the art that the invention can be practiced without regard to these specific details. In other instances, well known concepts have not been described in detail in order to avoid obscuring the present invention.

Embodiment 1

FIGS. 2A through 2L are simplified cross-sectional views of intermediate structures at different stages of a semiconductor device manufacturing method according to an embodiment of the present invention. FIG. 3 is a flowchart of a method for manufacturing a semiconductor device according to an embodiment of the present invention.

Figure 2A:
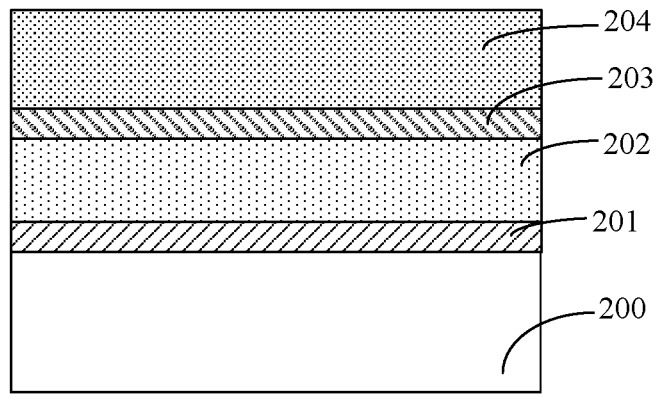
FIGS. 2A through 2L are simplified cross-sectional views of intermediate structures at different stages of a semiconductor device manufacturing method according to an embodiment of the present invention.
Figure 3:
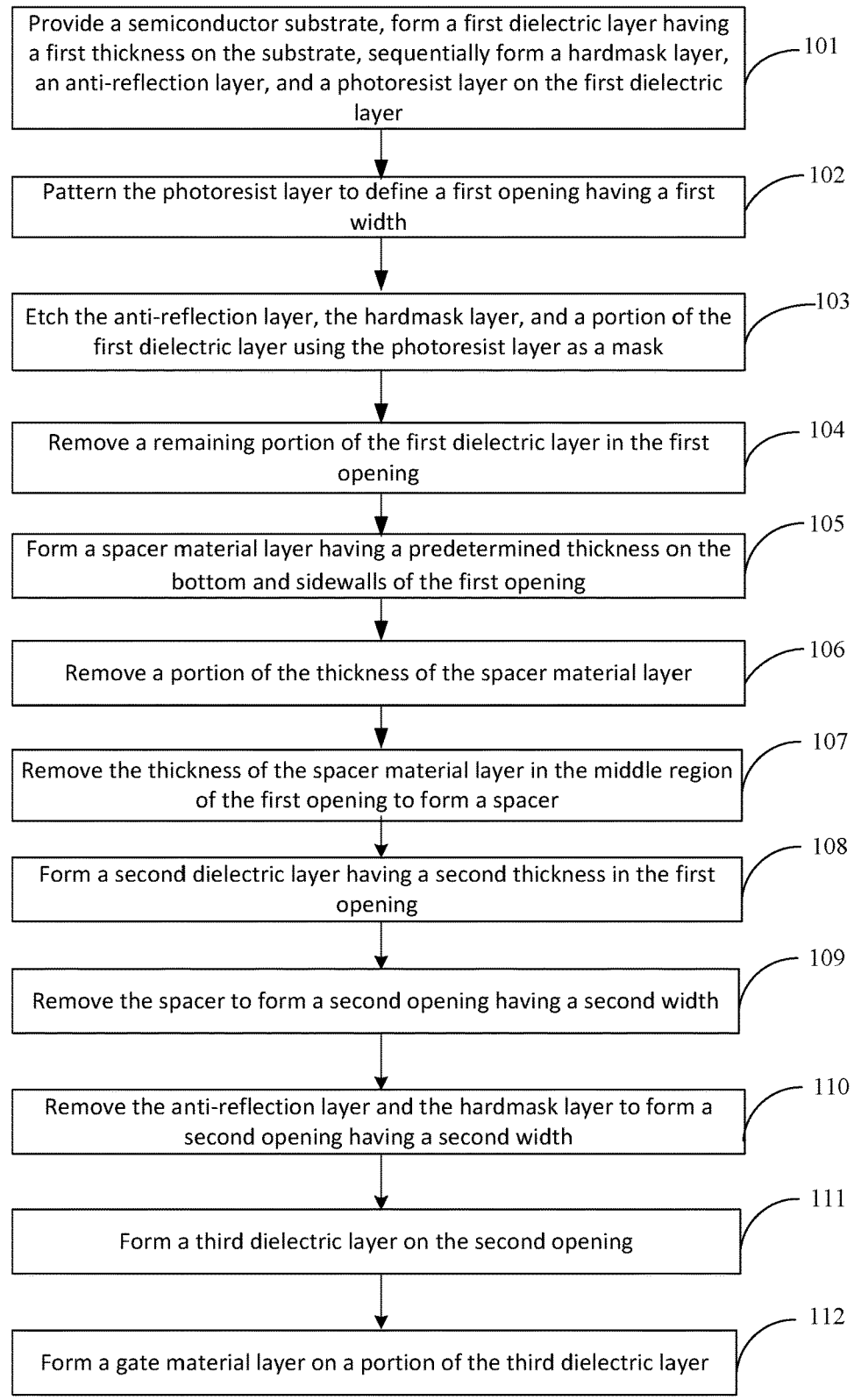
FIG. 3 is a flowchart of a method for manufacturing a semiconductor device according to an embodiment of the present invention.

With reference to FIGS. 2A-2L and FIG. 3, a method for manufacturing a semiconductor device according to an embodiment of the present invention will be described in detail. The method may include the following steps:

Step 101: providing a semiconductor substrate 200; forming a first dielectric layer 201 having a first thickness on semiconductor substrate 200; forming a hardmask layer 202 on first dielectric layer 201, an anti-reflection layer 203 on hardmask layer 202; and forming a photoresist layer 204 on anti-reflection layer 203, as shown in FIG. 2A.

Semiconductor substrate 200 may be one of Si, Ge, SiGe, SiGeC, InAs, GaAs, InP, or III/V compound semiconductors. Semiconductor substrate 200 may include a multilayer structure, silicon-on-insulator (SOI), stacked silicon-on-insulator (SSOI), stacked SiGe on insulator (S-SiGeOI), SiGeOI, and GeOI, and combinations thereof. Other devices may also be formed on the semiconductor substrate, such as NMOS and/or PMOS transistors. Further, a conducting structure may also be formed in the semiconductor substrate, e.g., the conducting structure may be a transistor gate, source or drain, and/or a metal interconnect structure may be formed to connect to transistors and other devices. In addition, an isolation structure, e.g., a shallow trench isolation (STI) structure or a local oxidation of silicon (LOCOS) isolation structure can be formed in the semiconductor substrate. In the embodiment of the present invention, the semiconductor substrate includes a single crystal material having a thickness of 1000 nm to 2000 nm.

First dielectric layer 201 is an insulation layer, such as a gate oxide layer, first dielectric layer 201 may be made of any suitable insulating material. First dielectric layer 201 has a first thickness, which depends from design requirements and applications of the device. In the embodiment, first dielectric layer 201 is a gate oxide layer comprising silicon dioxide having a thickness of 45 nm. First dielectric layer 201 may be formed using conventional deposition processes, such as physical vapor deposition (PVD), chemical vapor deposition (CVP), atomic layer deposition (ALD), and thermal oxidation processes. In an exemplary embodiment, a thermal oxidation process is used to form a silicon dioxide layer for first dielectric layer 201 or a gate oxide layer.

Hardmask layer 202 and anti-reflection layer 203 may be formed using any suitable material. In the embodiment, hardmask layer 202 is made of silicon nitride having a thickness of 150 nm, anti-refection layer 203 is made of silicon oxynitride having a thickness of 15 nm, which can reduce the reflection of the silicon nitride layer in a subsequent lithography process, thereby improving the accuracy of the lithography process.

Photoresist layer 204 may be any suitable positive or negative photoresist material, and its thickness depends from application requirements and can be in the range of 5000 Å to 7000 Å.

Figure 2B:
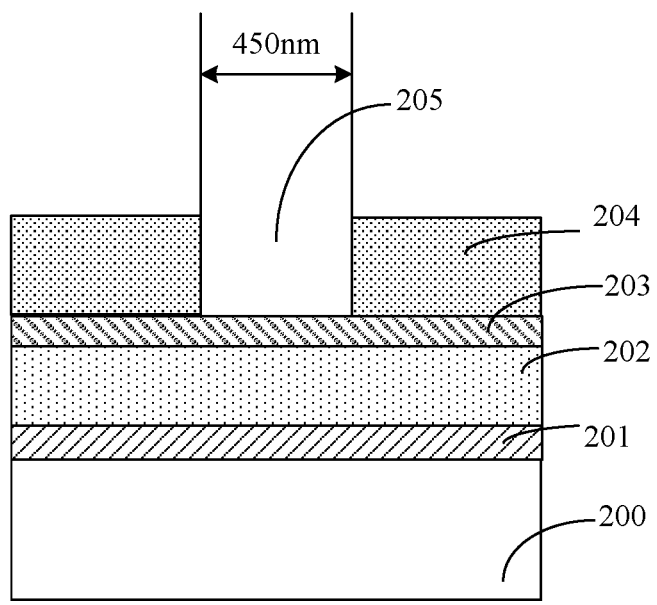

Step 102: patterning photoresist layer 204 to define a first opening having a first width 205. As shown in FIG. 2B, photoresist layer 204 may be patterned using a conventional photolithographic process, such as exposure, development and other operations to form first opening 205 with a first width. The width of the first opening is relatively large, so that existing photolithographic equipment and technology can be used to lower the process cost. In an exemplary embodiment, the first width of the first opening is 450 nm.

Figure 2C:
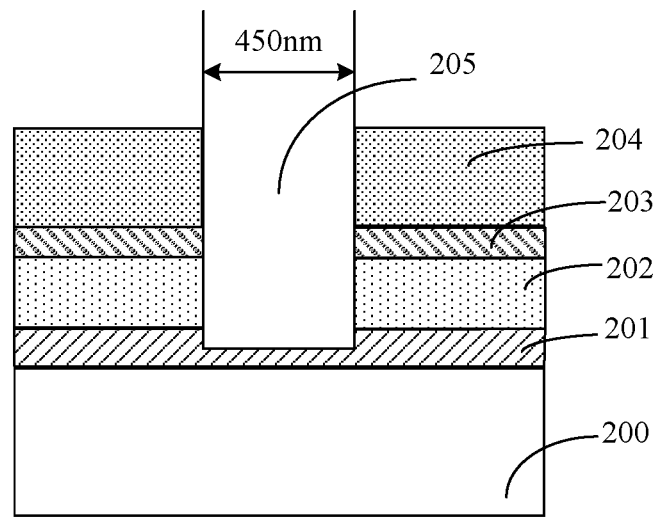

Step 103: performing an etching process on anti-reflection layer 203, hardmask layer 202, and first dielectric layer 201 using the patterned photoresist layer as a mask. The pattern of patterned photoresist layer 204 is transferred to anti-reflection layer 203, hardmask layer 202, and first dielectric layer 201, as shown in FIG. 2C.

In the embodiment, the etching process may be a dry etching process, which may include, but is not limited to, reactive ion etching (ME), ion beam etching, plasma etching, or laser cutting. The dry etching source gases may include CF4, CHF3, or other fluorocarbon containing etching gases.

In an exemplary embodiment, the dry etching process is performed with an etching gas including CF4 or CHF3, at a respective flow rate of 50 sccm to 500 sccm or 10 sccm to 100 sccm, and under a pressure of about 2 mTorr to about 50 mTorr.

It is appreciated that, in the embodiment, the etching of anti-reflection layer 203, hardmask layer 202, and first dielectric layer 201 can be conducted in three etching steps, where an appropriate etching gas and etching process parameters are chosen for each step according to the materials used in the respective anti-reflection layer, hardmask layer, and first dielectric layer.

Further, in the embodiment, in order to prevent any damage to the semiconductor substrate during the etching process, when etching first dielectric layer 201, only a portion of the thickness and not the entire thickness of the first dielectric layer is removed to protect semiconductor substrate 200. In an exemplary embodiment, a thickness of about 100 Å of first dielectric layer 201 is retained in first opening 205 to prevent any damage to the semiconductor substrate caused by the etching process at step 203.

Figure 2D:
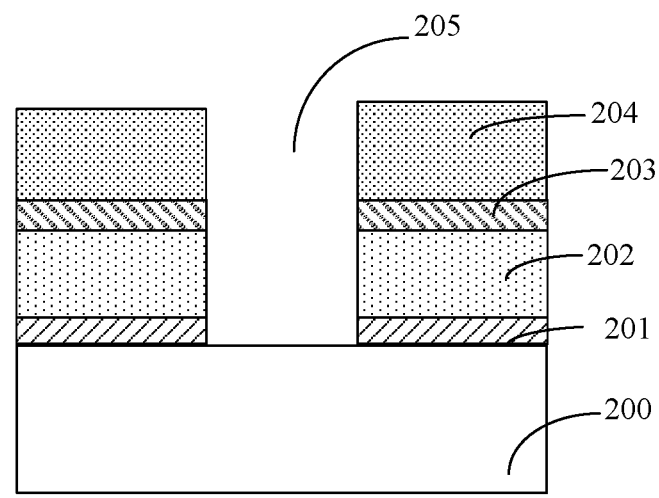

Step 104: removing the remaining portion of the thickness of first dielectric layer 201 in first opening 205 to form a structure as shown in FIG. 2D.

In an exemplary embodiment, the remaining portion of first dielectric layer 201 in first opening 205 can be removed using a buffered oxide etchant (BOE) solution to form an opening having a first width exposing a surface of semiconductor substrate 200. The buffered oxide etchant solution can be formed of a mixture of HF and NH4F with suitable proportions. HF is the main etchant component, and NH4F is used as a buffer to determine the etchant concentration according specific requirements.

In addition, after performing step 104, the method may include removing photoresist layer 204 using conventional dry or wet etching techniques, which may include ashing or solvent removal technique.

Figure 2E:
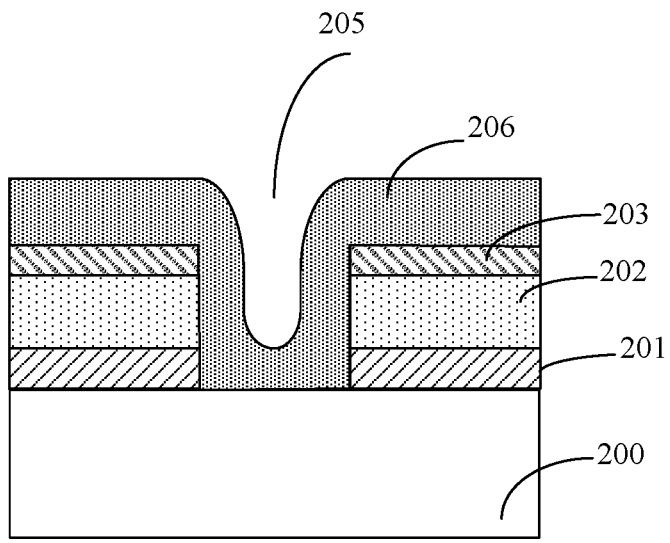

Step 105: forming a spacer material layer 206 having a predetermined thickness on the exposed surface of the semiconductor substrate and sidewalls of first opening 205 to obtain a structure as shown in FIG. 2E.

In an exemplary embodiment, spacer material layer 206 is an oxide. In the embodiment, a PECVD TEOS process is used to form spacer material layer 206 having a predetermined thickness on the bottom and sidewalls of first opening 205. The thickness of spacer material layer 206 determines the dimension of a subsequently formed tunnel oxide layer, which will be described in detail below. In a specific embodiment, the thickness of spacer material layer 206 is about 1700 Å.

It is appreciated that the predetermined thickness of spacer material layer 206 refers to the thickness of spacer material layer 206 disposed on the bottom of first opening 205 and on the top surface of anti-reflection layer 203, or the thickness of spacer material layer 206 disposed on the sidewalls of first opening 205 is greater than the predetermined thickness. In other words, if the predetermined thickness is 1700 Å, then the thickness in the middle (center) region of first opening 205 and the thickness on the top surface of anti-reflection layer 203 each are 1700 Å, the thickness of spacer material layer 206 disposed on the sidewalls of first opening 205 is greater than 1700 Å.

Figure 2F:
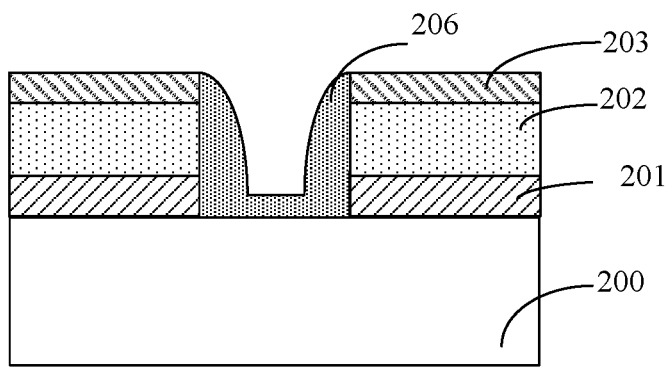

Step 106: removing a portion of the thickness of spacer material layer 206 by etching to form a structure as shown in FIG. 2F.

Referring to FIG. 2F, a portion of the thickness of spacer material layer 206 may be removed, such as 1500 Å from the predetermined thickness of 1700 Å.

It is appreciated that, because the thickness of spacer material layer 206 on the sidewalls is greater than the predetermined thickness, when a thickness 1600 Å of the spacer material layer on the middle portion of first opening 205 is removed, a sufficient thickness of the spacer material layer is still remained on the sidewalls of first opening 205.

In addition, in order to prevent damage to the substrate during etching, a portion of the thickness of spacer material layer 206 is retained, such as a thickness of 100 Å of the spacer material layer is retained. After step 206, the spacer material layer in the middle region of the first opening has a thickness of about 100 Å, and the spacer material layer on the sidewalls of the first opening has a thickness greater than 100 Å.

Figure 2G:
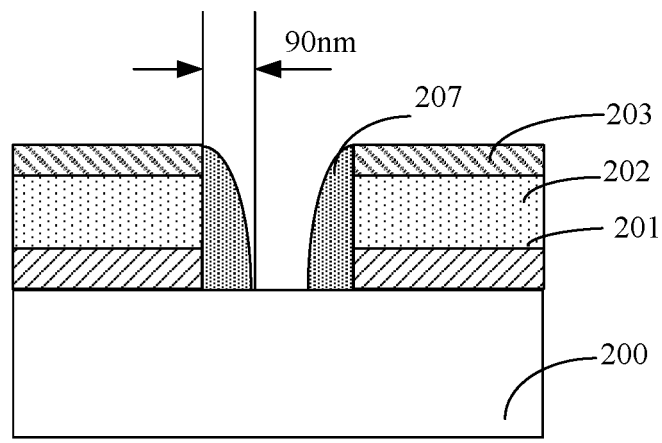
Figure 2H:
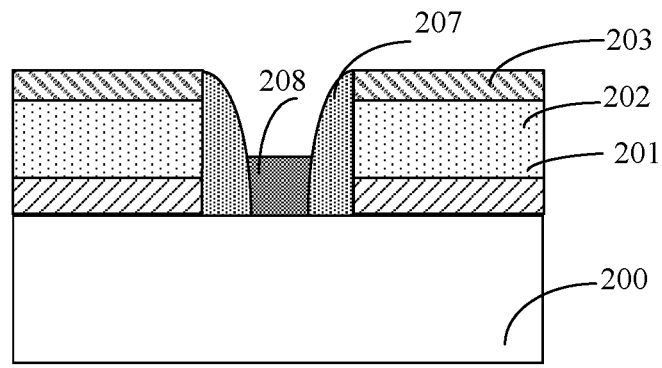
Figure 2I:
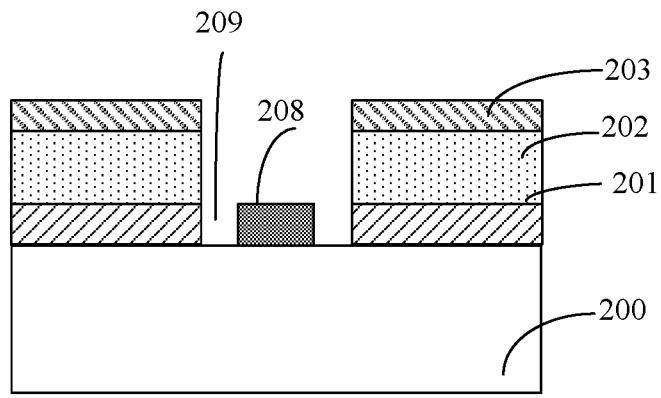

Step 107: removing the thickness of the spacer material layer disposed in the middle region of the first opening to form a structure as shown in FIG. 2G.

In an exemplary embodiment, the portion of the spacer material layer disposed in the middle region of the first opening may be removed using a buffered oxide etchant (BOE) solution, which also removes a certain thickness of the spacer material layer disposed on the sidewalls. For example, a thickness of 90 Å of the spacer material layer on the sidewalls is remained to form a spacer 207 while the spacer material layer in the middle region of the first opening is removed.

It is appreciated that the width of spacer 207 is related to the thickness of spacer material layer 206, or, described differently, the width of the middle region in first opening 205 having the predetermined thickness of the spacer material layer and the thickness of spacer material layer 206 are related to each other. Those skilled in the art may determine the required width of spacer 207 based on the predetermined thickness of spacer material layer 206 in first opening 206 and the amount of the spacer material layer that needs to be etched in steps 106 and 107.

Step 108: forming a second dielectric layer 208 having a second thickness in first opening 205.

In an exemplary embodiment, second dielectric layer 208 is an oxide that can be formed (a thermally grown oxide layer) on semiconductor substrate 200 in a thermal furnace. The thickness of second dielectric layer 208 is about 400 Å according to one embodiment. It is appreciated that the thickness of second dielectric layer 208 can be determined according to application requirements. In the embodiment, the thickness of second dielectric layer 208 is smaller than the thickness of first dielectric layer 201, i.e., the second thickness is smaller than the first thickness. In some embodiments, the second thickness may be greater than or equal to the first thickness.

Step 109: removing spacer 207 on the sidewalls of first opening 205 to form a second opening 209 having a second width, as shown in a structure of FIG. 21.

In the embodiment, an HF solution having a ratio of HF (hydrofluoric acid) to water of about 50:1 is used to remove spacer 207 on the sidewalls of first opening 205, because the concentration ratio of the 50:1 HF solution and the etch rate ratio of TEOS to the thermal oxide is about 10:1, spacer 207 can be completely removed using the concentration ratio of HF to water of about 50:1, thereby ensuring that the thermal oxide layer in the middle region of a channel has a sufficient thickness. In the embodiment, second dielectric layer 208 has a thickness of about 300 Å after the wet etching process.

It is appreciated that, although spacer 207 includes TEOS and second dielectric layer 208 includes a thermal silicon oxide layer in the example embodiment, other suitable materials may also be used, as long as the spacer has a high etching selectivity relative to the second dielectric layer so that the second dielectric layer will not suffer any damage when the spacer is removed.

Figure 2J:
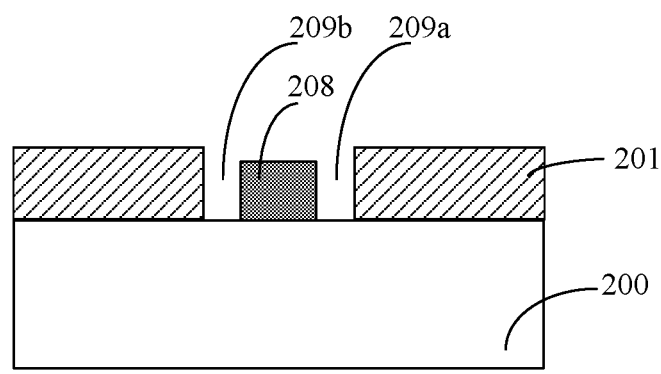

Step 110: removing anti-reflection layer 203 and hardmask layer 202 to form a second opening having a first portion 209a and a second portion 209b adjacent second dielectric layer 208, the first and second portion each have a second width that is smaller than the first width, as shown in FIG. 2J.

In an exemplary embodiment, anti-reflection layer 203 and hardmask layer 202 can be removed by wet etching, for example, using phosphoric acid solutions.

Figure 2K:
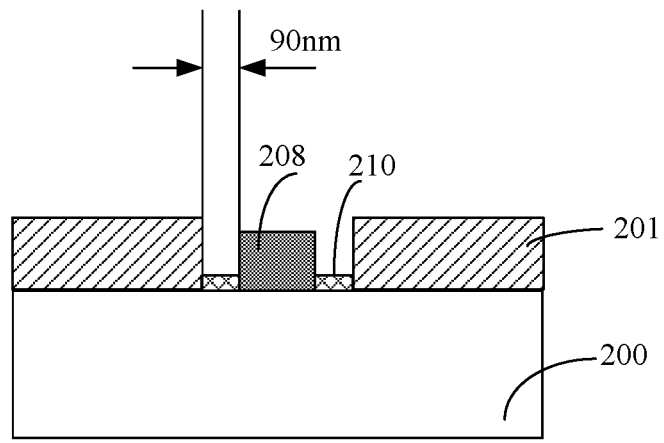
Figure 2L:
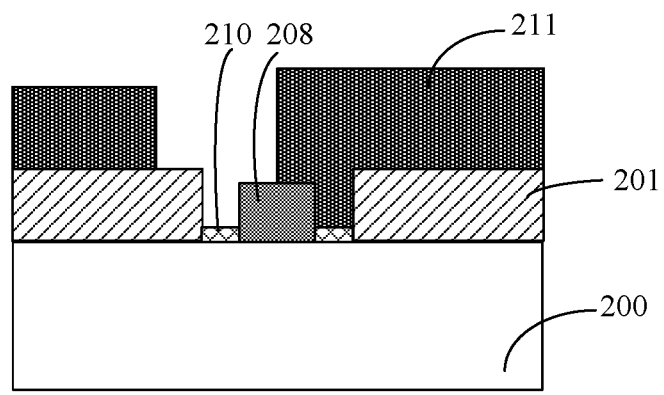

Step 111: forming a third dielectric layer 210 on the second opening having the second width, as shown in FIG. 2K.

In the embodiment, an oxide layer may be formed using an in-situ steam growth (ISSG) process on the second opening to form third dielectric layer 210 having a third thickness. In an example embodiment, the third thickness is about 80 Å.

It is appreciated that the thickness of third dielectric layer 210 is smaller than the thickness of first dielectric layer 201 and the thickness of second dielectric layer 208. However, the thickness of third dielectric layer 210 is not limited to 80 Å and can have other dimension depending from applications or design requirements. Since the thickness of third dielectric layer 210 is smaller than the thickness of first dielectric layer 201 and the thickness of second dielectric layer 208, the third dielectric layer is divided into two portions by second dielectric layer 208, as shown in FIG. 2K.

Step 112: forming a gate material layer 211 over one portion of third dielectric layer 210.

In an exemplary embodiment, gate material layer 211 may be formed using convention deposition processes, such as PVD, CVD, ALD, and the like.

It is appreciated that, since the gap between the two portions of the third dielectric layer is narrow, one portion of the third dielectric layers can be used as a tunneling oxide layer, and a floating gate can be formed thereon, in order to prevent that, in the case after the tunneling oxide layer is formed, a dielectric layer cannot be formed subsequently between the floating gates on the two tunneling oxide layers.

This completes the process steps of the manufacturing method according to some embodiments of the present invention. It is understood that that the above-described method may include other steps other than the above-described steps, such as forming ONN layers or control gate layers, forming source/drain, and other steps that are also included within the scope of the present invention.

Embodiment 2

Figure 4:
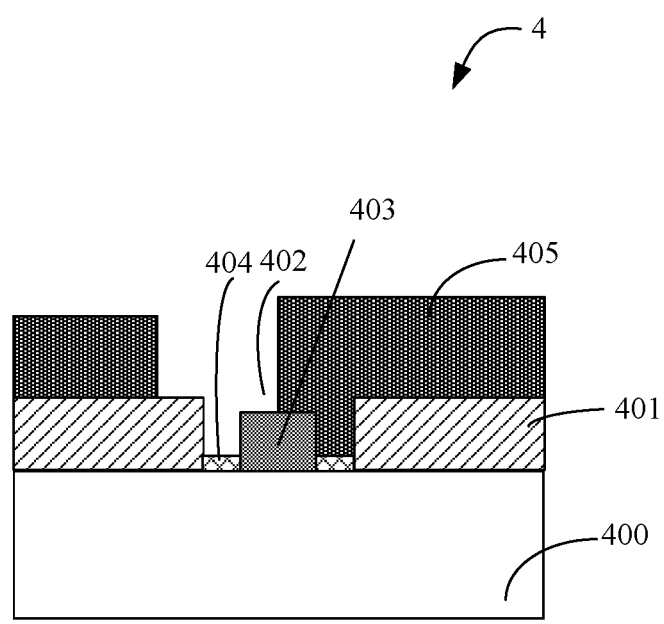
FIG. 4 is a simplified cross-sectional view of a semiconductor device according to an embodiment of the present invention.

Embodiments of the present invention provide a semiconductor device 4, as shown in FIG. 4. Semiconductor device 4 may include a semiconductor substrate 400, a first dielectric layer 401 having a first thickness on semiconductor substrate 400, a first opening 402 having a first width in first dielectric layer 401, a second dielectric layer 403 having a second thickness disposed in a middle region of first opening 402, and a third dielectric layer 404 having a first portion and a second portion disposed on opposite sides of second dielectric layer 403. Third dielectric layer 404 has a third thickness that is smaller than the first thickness of first dielectric layer 401 and the second thickness of second dielectric layer 408. The width of the first and second portions of third dielectric layer 404 is smaller than the first width of first opening 402.

Semiconductor device 4 further includes a gate material layer 405 over the first portion of third dielectric layer 403.

Semiconductor substrate 400 may be one of Si, Ge, SiGe, SiC, SiGeC, InAs, GaAs, InP, or III/V compound semiconductor materials. Semiconductor substrate 400 may also include a multilayer structure, silicon-on-insulator (SOI), stacked silicon-on-insulator (SSOI), stacked SiGe on insulator (S-SiGeOI), SiGeOI, and GeOi, and combinations thereof. Semiconductor substrate 400 may further include other devices, such as NMOS and/or PMOS transistors. In addition, semiconductor substrate 400 may also include a conducting structure, such as a transistor gate, source or drain, and/or a metal interconnect structure configured to connect transistors and other devices to each other. In addition, semiconductor substrate 400 may also include an isolation structure, e.g., a shallow trench isolation (STI) structure or a local oxidation of silicon (LOCOS) isolation structure. In the embodiment of the present invention, the semiconductor substrate includes a single crystal material.

First, second, third dielectric layers 401, 403, 404 may include an oxide, such as silicon dioxide, that can be formed using PECVD, TEOS, ISSG or thermal oxide forming techniques. Gate material layer 405 may be a polysilicon formed by PVD, CVD, ALD, and other conventional deposition processes.

Embodiment 3

Embodiments of the present invention also provide an electronic device, which may include an electronic component and a semiconductor device electrically connected to the electronic component. The semiconductor device can be manufactured according to the above-described method.

In an embodiment, the semiconductor device may include a semiconductor substrate, a first dielectric layer having a first thickness on semiconductor substrate, a first opening having a first width in first dielectric layer, a second dielectric layer having a second thickness disposed in a middle region of first opening, and a third dielectric layer having a first portion and a second portion disposed on opposite sides of second dielectric layer. The third dielectric layer has a third thickness that is smaller than the first thickness of the first dielectric layer and the second thickness of the second dielectric layer. The width of the first and second portions of third dielectric layer is smaller than the first width of the first opening.

The semiconductor device further includes a gate material layer disposed over the first portion of the third dielectric layer.

The semiconductor substrate may be one of Si, Ge, SiGe, SiC, SiGeC, InAs, GaAs, InP, or III/V compound semiconductor materials. The semiconductor substrate may also include a multilayer structure, silicon-on-insulator (SOI), stacked silicon-on-insulator (SSOI), stacked SiGe on insulator (S-SiGeOI), SiGeOI, and GeOi, and combinations thereof. The semiconductor substrate may further include other devices, such as NMOS and/or PMOS transistors. In addition, the semiconductor substrate may also include a conducting structure, such as a transistor gate, source or drain, and/or a metal interconnect structure configured to connect transistors and other devices to each other. In addition, the semiconductor substrate may also include an isolation structure, e.g., a shallow trench isolation (STI) structure or a local oxidation of silicon (LOCOS) isolation structure. In the embodiment of the present invention, the semiconductor substrate includes a single crystal material.

The first, second, and third dielectric layers may include an oxide, such as silicon dioxide, that can be formed using PECVD, TEOS, ISSG or thermal oxide forming techniques. The gate material layer may be of a polysilicon layer formed by PVD, CVD, ALD, and other conventional deposition processes.

In an embodiment, the electronic device may include a semiconductor device fabricated using the above-described method. The electronic device may be a mobile phone, a laptop, a netbook, a tablet PC, a game console, a TV, a DVD player, a GPS device, a camera, a voice recorder, MP3 player, MP4 player, PSP player, and other semiconductor devices including intermediate products and electronic components that are manufactured using the above-described method to have the above-described cost advantages.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a semiconductor substrate;
   a first dielectric layer having a first thickness on the semiconductor substrate;
   a first opening having a first width in the first dielectric layer;
   a second dielectric layer having a second thickness disposed in a middle region of the first opening; and
   a third dielectric layer having a first portion and a second portion disposed on opposite sides of second dielectric layer, the first portion and the second portion having a second width smaller than the first width, and the third dielectric layer having a third thickness smaller than the first thickness and the second thickness.

2. The semiconductor device of claim 1, further comprising:
   a gate material layer on the third dielectric layer.

3. The semiconductor device of claim 2, wherein the gate material layer is disposed on one of the first and second portions of the third dielectric layer.

4. An electronic device comprising a semiconductor device and an electronic component connected to the semiconductor device, wherein the semiconductor device comprises:
   a semiconductor substrate;
   a first dielectric layer having a first thickness on the semiconductor substrate;
   a first opening having a first width in the first dielectric layer;
   a second dielectric layer having a second thickness disposed in a middle region of the first opening; and
   a third dielectric layer having a first portion and a second portion disposed on opposite sides of second dielectric layer, the first portion and the second portion having a second width smaller than the first width, and the third dielectric layer having a third thickness smaller than the first thickness and the second thickness.

5. The electronic device of claim 4, wherein the semiconductor device further comprises a gate material layer disposed on the third dielectric layer.

6. The electronic device of claim 5, wherein the gate material layer is disposed on one of the first and second portions of the third dielectric layer.

* * * * *